(12) United States Patent
Fuderer et al.

(10) Patent No.: US 11,959,986 B2
(45) Date of Patent: Apr. 16, 2024

(54) MR IMAGING WITH SPIRAL ACQUISITION

(71) Applicant: KONINKLIJKE PHILIPS N.V., Eindhoven (NL)

(72) Inventors: Miha Fuderer, Eindhoven (NL); Silke Hey, Best (NL)

(73) Assignee: Koninklijke Philips N.V., Eindhoven (NL)

(*) Notice: Subject to any disclaimer, the term of this patent is extended or adjusted under 35 U.S.C. 154(b) by 652 days.

(21) Appl. No.: 16/979,940

(22) PCT Filed: Mar. 5, 2019

(86) PCT No.: PCT/EP2019/055371
§ 371 (c)(1),
(2) Date: Sep. 11, 2020

(87) PCT Pub. No.: WO2019/174964
PCT Pub. Date: Sep. 19, 2019

(65) Prior Publication Data
US 2021/0011102 A1    Jan. 14, 2021

(30) Foreign Application Priority Data
Mar. 13, 2018 (EP) .................................. 18161385

(51) Int. Cl.
*G01R 33/48* (2006.01)
*G01R 33/24* (2006.01)
*G01R 33/565* (2006.01)

(52) U.S. Cl.
CPC ....... *G01R 33/4826* (2013.01); *G01R 33/243* (2013.01); *G01R 33/4828* (2013.01); *G01R 33/56563* (2013.01)

(58) Field of Classification Search
CPC .............. G01R 33/243; G01R 33/4828; G01R 33/56563; G01R 33/4824
See application file for complete search history.

(56) References Cited

U.S. PATENT DOCUMENTS 5,270,653 A * 12/1993 Pauly ................... G01R 33/446
324/309
6,215,306 B1   4/2001 Tsai et al.
(Continued)

FOREIGN PATENT DOCUMENTS

WO        2003100378 A2   12/2003

OTHER PUBLICATIONS

"Fast Magnetic Resonance Coronary Angiography With a Three-Dimensional Stack of Spirals Trajectory" by D.R. Thedens et al. Mag Res in Med. 41:1170-1179 (Year: 1999).*
(Continued)

*Primary Examiner* — Jason M Ip

(57) ABSTRACT

The invention relates to a method of MR imaging of an object (10) positioned in an examination volume of a MR device (1). It is an object of the invention to enable efficient spiral MR imaging even in situations of strong B0 inhomogeneity. The method of the invention comprises: subjecting the object (10) to an imaging sequence comprising at least one RF excitation pulse and sinusoidally modulated magnetic field gradients, acquiring MR signals along two or more spiral k-space trajectories (31, 32, 33) as determined by the sinusoidal modulation of the magnetic field gradients, wherein the origins of the spiral k-space trajectories are offset from each other, and reconstructing an MR image from the acquired MR signals. Moreover, the invention relates to a MR device (1) and to a computer program for a MR device (1).

14 Claims, 2 Drawing Sheets

(56) References Cited

U.S. PATENT DOCUMENTS

| | | | |
|---|---|---|---|
| 6,281,681 | B1 | 8/2001 | Cline et al. |
| 2007/0255129 | A1 | 11/2007 | Du et al. |
| 2010/0145185 | A1 | 6/2010 | Hong et al. |
| 2011/0254547 | A1* | 10/2011 | Reeder ............... G01R 33/4828 324/309 |
| 2012/0146642 | A1 | 6/2012 | Du |
| 2013/0249549 | A1* | 9/2013 | Pfeuffer ................. G01R 33/28 324/309 |
| 2014/0145718 | A1* | 5/2014 | Gulaka ............ G01R 33/56509 324/309 |
| 2014/0232395 | A1 | 8/2014 | Sutton et al. |
| 2015/0260815 | A1* | 9/2015 | Nishihara .......... G01R 33/4836 324/309 |
| 2016/0313431 | A1 | 10/2016 | Beck et al. |

OTHER PUBLICATIONS

Ahunbay et al Rapid Method for Deblurring Spiral Images Magn. Reson Med. 2000 VO. 44, p. 491-494.

Sutton et al "Fast Iterative Image Reconstruction for MRI in the Presence of Field Inhomogeneties" IEEE Trans. Med. Imaging 2003 vol. 22, PL 178-188.

Nayak et al "Efficient Off-Resonance Correction for Spiral Imaging" Magn. Reson. Med 2001 vol. 45, p. 521-524.

Wang et al Single Shot Three Dimensional Pulse Sequence for Hyperpolarized 13C MRI Magnetic Reson. in Med. vol. 77, No. 2 Feb. 24, 2016 p. 740-752.

Zhu et al "High Temporal and Spatial Resolution 4D MRA Using Spiral Data Sampling and Sliding Window Reconstruction" Magnetic Resonance in Med. vol. 52, No. 1, Jul. 2004 p. 14-18.

Ooi et al "Spiral Deblurring Using BO Maps With BO Drift Correction" Procedings of the International Soc. for Mag. Reson. in Med. No. 1760 Apr. 22, 2016.

Granlund et al "Multi-Frequency Off-Resonance Correction and Water/Fat Separation for Spiral Breast Imaging" Proc. of the Int. Soc. for Magn. Reson. in Med. May 3, 2008 p. 587.

Maeda et al "Analysis of Field Inhomogeneity Effects in MRI With Time Varying Gradients" Proceedings of the Int. Soc. for Magn. Reson. in Med. Aug. 17, 1987.

International Search Report and Written Opinion From PCT/EP2019/055371 dated May 13, 2019.

Jung et al "Consistent Non-Cartesian Off-Axis MRI Quality: Calibration and Removing Multiple Sources of Demodulation Phase Errors" Magn. Reson. in Med. 57 p. 206-212 (2007).

Magland et al "General Algorithm for Automated Off-Center MRI" Magnetic Reson. in Med. 56 p. 230-233 (2006).

Mir et al "Fast Three-Dimensional K-Space Trajectory Design Using Missile Guidance Ideas" Magn. Reson. Med 52 p. 329-336 (2004).

Tsai et al "Off Center Spiral Trajectories" Magn. Reson in Med. 43 p. 446-451 (2000).

* cited by examiner

MR IMAGING WITH SPIRAL ACQUISITION

CROSS REFERENCE TO RELATED APPLICATIONS

This application is a U.S. national phase application of International Application No. PCT/EP2019/055371 filed on Mar. 5, 2019, which claims the benefit of EP Application Serial No. 18161385.2 filed on Mar. 13, 2018 and is incorporated herein by reference.

FIELD OF THE INVENTION

The invention relates to the field of magnetic resonance (MR) imaging. It concerns a method of MR imaging of an object. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for imaging of soft tissue they are superior to other imaging methods in many respects, do not require ionizing radiation and are usually not invasive.

According to the MR method in general, the object, for example the body of the patient to be examined, is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated, e.g., by means of a refocusing pulse (for example a 180° pulse). This produces an echo signal (spin echo) in the receiving coils.

To realize spatial resolution in the body, constant magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. A set of k-space data is converted to a MR image by means of an image reconstruction algorithm.

Spiral imaging is a fast MR imaging technique that benefits from an efficient k-space coverage and a low sensitivity to flow artifacts. It is, however, vulnerable to inhomogeneities in the amplitude of the main magnetic field $B_0$, which causes blurring and degrades the image quality. The extent of $B_0$ inhomogeneities scales with the main magnetic field strength.

De-blurring methods for spiral MR imaging are known in the art. It is known, e.g., to acquire a series of $B_0$ maps by using a dual-echo spiral-in/out sequence with different echo times (see, e.g., Ahunbay et al., "Rapid method for deblurring spiral MR images", Magn. Reson. Med. 2000, vol. 44, p. 491-494; Sutton et al., "Fast, iterative image reconstruction for MRI in the presence of field inhomogeneities", IEEE Trans. Med. Imaging. 2003, vol. 22, p. 178-188; Nayak et al., "Efficient off-resonance correction for spiral imaging", Magn. Reson. Med. 2001, vol. 45, p. 521-524).

In case of strong magnetic field inhomogeneities, the shape of the spiral k-space trajectories deviates to a correspondingly large extent from the theoretical spiral shape. This is illustrated in the two-dimensional k-space diagrams of FIG. 2. FIG. 2a shows an 'ideal' spiral k-space trajectory as it would be obtained by application of sinusoidal magnetic field gradients in the $k_x$- and $k_y$-directions in the presence of a perfectly homogeneous main magnetic field $B_0$. In FIG. 2b, $B_0$ is inhomogeneous with a strong gradient in the x-direction such that the imaged object 'sees' a k-space trajectory which significantly deviates from the ideal spiral shape. The consequence of this effect is that practically no usable signal data is sampled from central k-space; $k_x=k_y=0$ is not even included in the distorted sampling trajectory. Entirely missing portions of k-space data may occur in areas of large $B_0$ non-uniformity. Similar effects may occur in the case of imperfections of the magnetic field gradients.

SUMMARY OF THE INVENTION

From the foregoing it is readily appreciated that there is a need for an improved MR imaging technique. It is an object of the invention to address the above-mentioned limitations and to enable efficient spiral MR imaging even in situations of strong $B_0$ inhomogeneity.

In accordance with the invention, a method of MR imaging of an object positioned in an examination volume of a MR device is disclosed. The method comprises:

subjecting the object to an imaging sequence comprising at least one RF excitation pulse and sinusoidally modulated magnetic field gradients, acquiring MR signals along two or more spiral k-space trajectories as determined by the sinusoidal modulation of the magnetic field gradients, wherein the origins of the spiral k-space trajectories are offset from each other, and reconstructing an MR image from the acquired MR signals.

In order to prevent that portions of central k-space are missing from spiral sampling in inhomogeneous $B_0$ fields, the invention proposes to apply two or more spiral k-space trajectories to acquire the MR signals. Because the origins of the spiral k-space trajectories are offset from each other, the center points of the spirals do not coincide and an improved k-space coverage can be achieved in the central k-space region where the spiral k-space trajectories are overlapping, even if the spirals are strongly distorted by $B_0$ inhomogeneity or magnetic field gradient imperfections. Preferably, the origins of all spiral k-space trajectories are offset from k-space origin, equally spaced and symmetrically arranged around k-space origin. In this way, an optimum sampling of the region around the center of k-space can be achieved essentially in all situations of $B_0$ non-uniformity or gradient imperfections met in practice.

Within the meaning of the invention, a spiral k-space trajectory is defined as a curve that turns around an origin at continuously increasing or decreasing distance. This definition covers (inter alia) a spiral in three-dimensional k-space, such as a conical helix, that winds around an axis, as well as a curve in a plane that winds around a fixed center point at a continuously increasing or decreasing distance from the center point, i.e., a spiral in two-dimensional k-space where the center point constitutes the origin of the spiral.

In a preferred embodiment, a $B_0$ map is derived from the MR signals, acquired from the central k-space region. The MR image may then be reconstructed with correction of $B_0$ inhomogeneity based on the derived $B_0$ map.

According to another preferred embodiment, the object is subjected to a preparation sequence prior to the imaging sequence, wherein a $B_0$ map is derived from MR signals acquired during the preparation sequence. The number and/or the arrangement of the spiral k-space trajectories in k-space may then be chosen automatically depending on the $B_0$ map in order to achieve an optimum coverage of central k-space. In order to avoid unnecessary scan time, the extent of $B_0$ non-uniformity may be assessed automatically by an appropriate algorithm which decides whether two or more spiral trajectories should be applied or whether it is sufficient to use only a single spiral k-space trajectory like in conventional spiral imaging.

In yet another preferred embodiment, the MR signals are acquired according to a stack-of-spirals scheme. In the known three-dimensional stack-of-spirals acquisition scheme, a number of spatially non-selective or slab-selective RF excitations is applied, each followed by the acquisition of one or more MR signals. A number of k-space spirals are arranged at different positions along the $k_z$-direction, standard Cartesian phase-encoding is performed in the $k_z$-direction. This results in a cylindrical k-space coverage composed of stacked discs (stack-of-spirals). Technically, this is realized by generating magnetic field gradients in the in-plane directions of the k-space spirals by sinusoidally modulating the gradient amplitudes. According to the invention, spiral k-space trajectories are acquired that are offset from each other. The stack of spirals includes a number of spirals that are not centered around the $k_z$-axis ($k_x=k_y=0$) in this embodiment. The offset from the $k_z$-axis may vary from k-space spiral to k-space spiral in the stack.

The MR signals may be acquired, e.g., as free induction decays (FID) immediately after the radiation of a respective RF excitation pulse. The MR signals may also be acquired as spin echo or gradient echo signals.

According to a preferred embodiment of the invention, the MR signals are acquired at two or more different echo times, wherein signal contributions from water protons and fat protons are separated in the step of reconstructing the MR image. In this embodiment, the method of the invention is applied in combination with Dixon water/fat separation. By means of Dixon MR imaging or Dixon water/fat MR imaging, a water/fat separation is achieved by calculating contributions of water and fat from two or more corresponding spirals acquired at different echo times. In general such a separation is possible because there is a known precessional frequency difference of hydrogen in fat and water. In its simplest form, water and fat images are generated by either addition or subtraction of the 'in-phase' and 'out-of-phase' datasets. However, several Dixon-type MR imaging methods have been proposed in recent years. Apart from different strategies for the water/fat separation, the known techniques are mainly characterized by the specific number of echoes (or 'points') they acquire and by the constraints that they impose on the used echo times. Conventional two- and three-point methods require in-phase and opposed-phase echo times at which the water and fat signals are parallel and antiparallel in the complex plane, respectively. Three-point methods have gradually been generalized to allow flexible echo times. A $B_0$ map can also be extracted from the Dixon datasets as a precise knowledge of the field distribution is required for correct water/fat separation in the presence of $B_0$ inhomogeneity. According to the invention, k-space is sampled two or more times in regions in which the two or more spiral k-space trajectories are overlapping, wherein the timing of the spiral k-space acquisitions can be selected such that a given position in k-space is visited two or more times, each time with a different (effective) echo time. This makes it possible to apply the afore-mentioned Dixon technique to separate signal contributions from water protons and fat protons.

The method of the invention described thus far can be carried out by means of a MR device including at least one main magnet coil for generating a uniform static magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing a MR image from the received MR signals. The method of the invention can be implemented, for example, by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
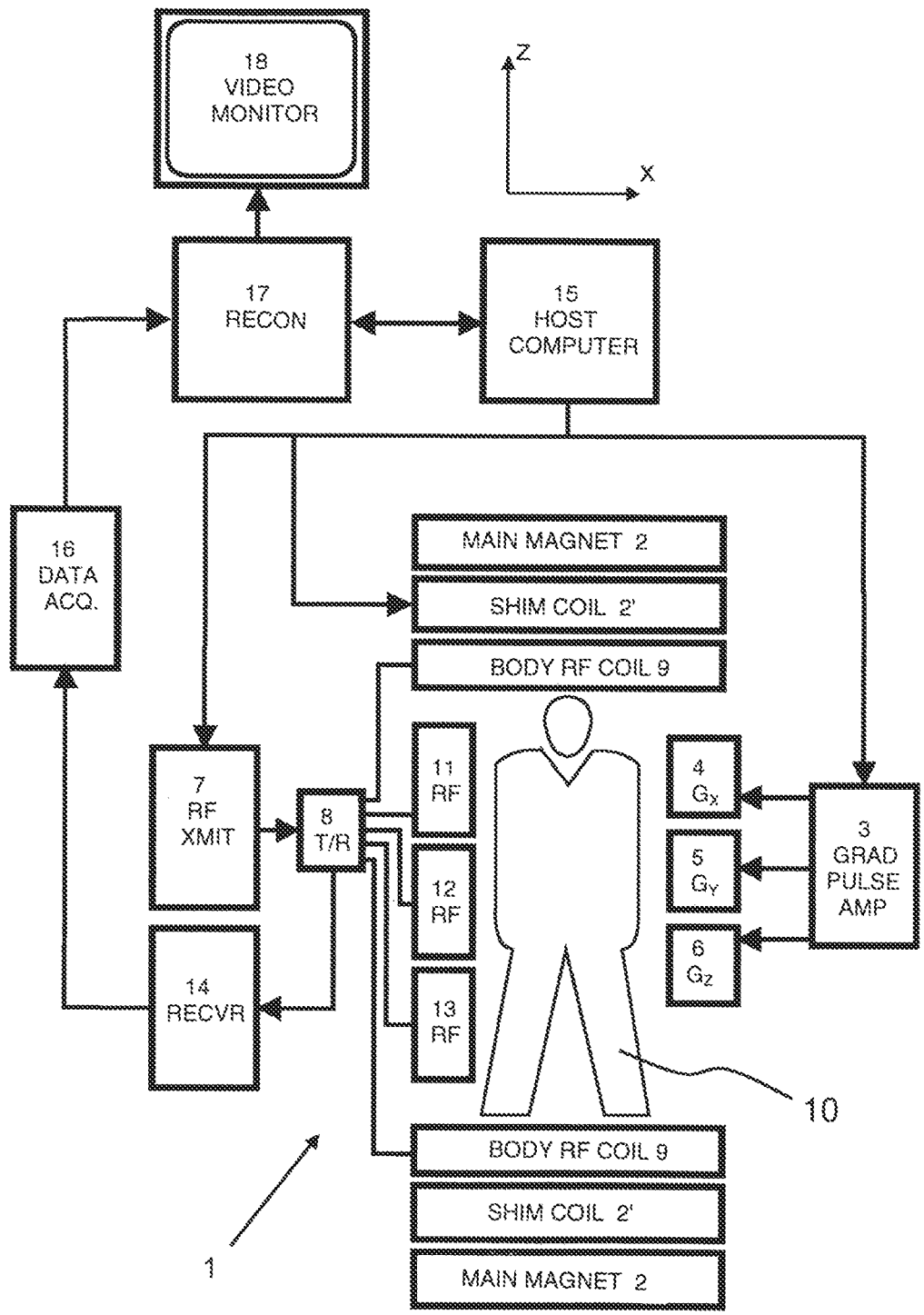
FIG. 1 shows a MR device for carrying out the method of the invention.

With reference to FIG. 1, a MR device 1 is schematically shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9.

For generation of MR images of limited regions of the body 10, a set of local array RF coils 11, 12, 13 are placed contiguous to the region selected for imaging. The array coils 11, 12, 13 can be used to receive MR signals induced by body-coil RF transmissions.

The resultant MR signals are picked up by the whole body volume RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo (TSE) imaging, and the like to acquire the MR signals along spiral k-space trajectories according to the invention. For the selected sequence, the receiver 14 receives a single or a plurality of MR data along the respective k-space trajectories in rapid succession following each RF excitation pulse. A data acquisition system 16 performs analog-to-digital conversion of the received signals and converts each MR signal to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

The MR device 1 is arranged, e.g. by appropriate programming of the host computer 15 and the reconstruction processor 17, to perform the imaging method of the invention as described herein above and in the following.

Figure 3:
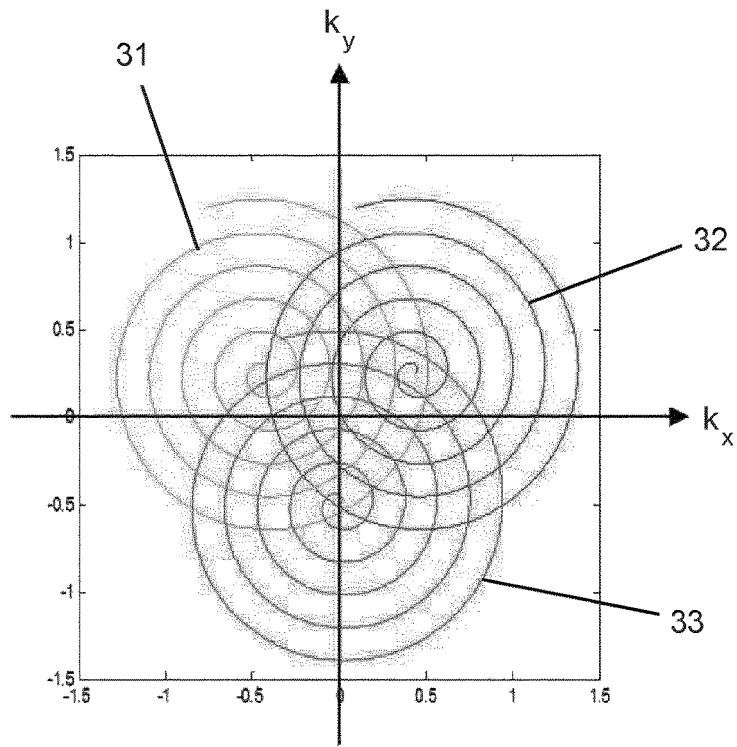
FIG. 3 shows a diagram of k-space illustrating the approach of the invention.

With continuing reference to FIG. 1 and with further reference to FIG. 3, an embodiment of the imaging approach of the invention is explained.

Figure 2:
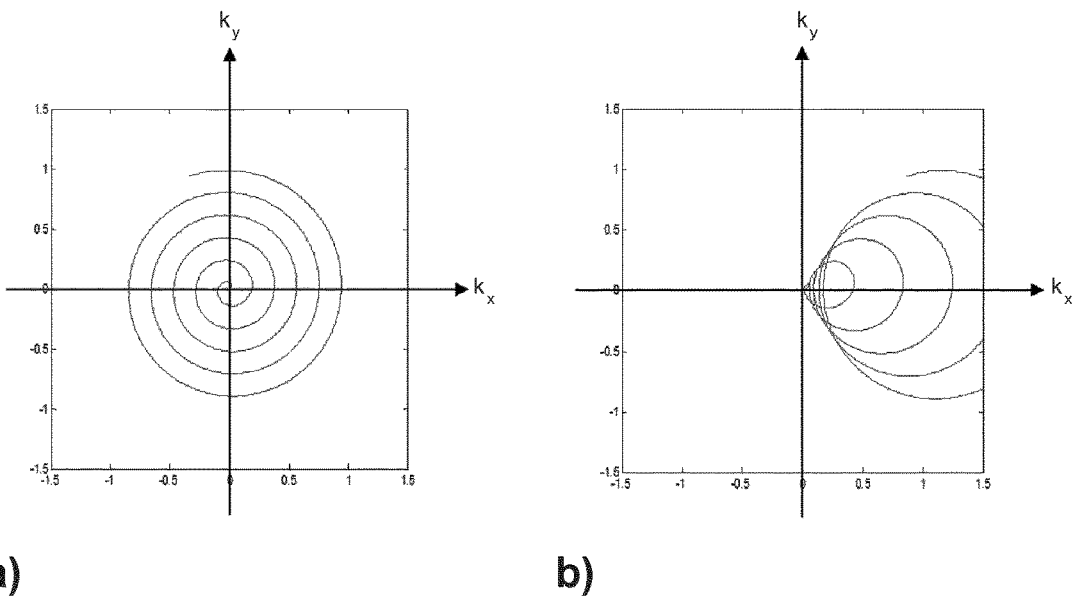
FIG. 2 shows a diagram of k-space illustrating an 'ideal' spiral k-space trajectory (a) and a distorted k-space spiral (b) in the presence of main magnetic field inhomogeneity.

FIG. 3 illustrates the spiral acquisition strategy of the invention. The invention proposes to apply multiple spiral k-space trajectories to acquire the MR signals in order to prevent that portions of central k-space are missing from spiral sampling in inhomogeneous $B_0$ fields (like in FIG. 2b). In the embodiment of FIG. 3, three k-space spirals 31, 32, 33 with non-coinciding center points (origins) in a symmetrical arrangement around the k-space center ($k_x=k_y=0$) are used for a two-dimensional scan. In a three-dimensional equivalent four three-dimensional spirals would have to be used with their axes arranged in, e.g., a tetrahedral fashion. In the embodiment shown in FIG. 3 it is guaranteed that signal data is actually sampled within the triangle spanned by the three center points of the spirals 31, 32, 33 allowing at least a low-resolution reconstruction of a region of high $B_0$ inhomogeneity.

The invention claimed is:

1. A method of magnetic resonance (MR) imaging of an object positioned in an examination volume of an MR device, the method comprising:
    subjecting the object to an imaging sequence comprising at least one RF excitation pulse and sinusoidally modulated magnetic field gradients,
    selecting two or more spiral k-space trajectories, wherein the origins of the spiral k-space trajectories are offset from each other in a plane of the spiral k-space trajectories, wherein the offset spiral k-space trajectories are overlapping in a region around k-space origin, wherein the origins of the spiral k-space trajectories are at least one of (i) offset from k-space origin, (ii) equally spaced from k-space origin, and (iii) symmetrically arranged around k-space origin, wherein each spiral k-space trajectory lies in a $k_x,k_y$ plane and the origins of the spiral k-space trajectories are offset from each other along a direction parallel with the $k_x,k_y$ plane;
    acquiring MR signals along the two or more spiral k-space trajectories;
    reconstructing an MR image from the acquired MR signals; and
    displaying the MR image.

2. The method of claim 1, wherein the origins of the spiral k-space trajectories are offset from k-space origin.

3. The method of claim 1, wherein the origins of the spiral k-space trajectories are equally spaced from k-space origin.

4. The method of claim 3, wherein the origins of the spiral k-space trajectories are symmetrically arranged around k-space origin.

5. The method of claim 1, wherein a $B_0$ map is derived from the MR signals, acquired from the region around k-space origin.

6. The method of claim 5, wherein the MR image is reconstructed with correction of $B_0$ inhomogeneity based on the derived $B_0$ map.

7. The method of claim 1, wherein the object is subjected to a preparation sequence prior to the imaging sequence, wherein a $B_0$ map is derived from MR signals acquired during the preparation sequence.

8. The method of claim 7, wherein at least one of the number or the arrangement of the spiral k-space trajectories in k-space is chosen automatically depending on the $B_0$ map.

9. The method of claim 1, wherein the MR signals are acquired according to a stack-of-spirals scheme from a number of parallel k-space slices arranged at adjacent positions along a direction perpendicular to the k-space slices.

10. The method of claim 1, wherein the MR signals are acquired at two or more different echo times, wherein signal contributions from water protons and fat protons are separated in the step of reconstructing the MR image.

11. The method of claim 1, wherein k-space is sampled in three dimensions by the two or more spiral k-space trajectories.

12. A magnetic resonance (MR) device comprising:
    at least one main magnet coil for generating a uniform, static magnetic field within an examination volume;
    gradient coils for generating switched magnetic field gradients in different spatial directions within the examination volume;
    at least one RF coil for generating RF pulses within the examination volume and/or for receiving MR signals from an object positioned in the examination volume;
    a control unit for controlling a temporal succession of the RF pulses generated by the at least one RF coil and the switched magnetic field gradients generated by the gradient coils;
    a video monitor; and
    a reconstruction unit for reconstructing a MR image from the received MR signals, wherein the MR device is arranged to perform the following steps:
        subjecting the object to an imaging sequence comprising at least one RF excitation pulse and sinusoidally modulated magnetic field gradients,
        selecting two or more spiral k-space trajectories, wherein each spiral k-space trajectory lies in a $k_x$-$k_y$ plane and the origins of the spiral k-space trajectories are offset from each other in the $k_x$ and/or $k_y$ directions, wherein the offset spiral k-space trajectories are overlapping in a region around k-space origin;
        acquiring MR signals along the two or more spiral k-space trajectories;
        reconstructing an MR image from the acquired MR signals; and
        displaying the MR image on the video monitor.

13. A computer program stored on a non-transitory computer readable medium, to be run on a magnetic resonance (MR) device, which computer program comprises instructions for:
    generating an imaging sequence comprising at least one RF excitation pulse and sinusoidally modulated magnetic field gradients;
    selecting MR signals along two or more spiral k-space trajectories, wherein each spiral k-space trajectory lies in a $k_x$-$k_y$ plane and the origins of the spiral k-space trajectories are offset from each other along a direction parallel with the $k_x$-$k_y$ plane, wherein the offset spiral k-space trajectories are overlapping in a region around k-space origin;
    acquiring MR signals along the two or more spiral k-space trajectories;
    reconstructing an MR image from the acquired MR signals; and
    displaying the MR image.

14. The method of claim 1, wherein the origins of the spiral k-space trajectories are offset from each other in the $k_x$ and/or $k_y$ directions.

* * * * *